(12) United States Patent
Watanabe

(10) Patent No.: US 8,102,719 B2
(45) Date of Patent: Jan. 24, 2012

(54) SEMICONDUCTOR MEMORY DEVICE CAPABLE OF COMPENSATING VARIATION WITH TIME OF PROGRAM VOLTAGE

(75) Inventor: Yoshihisa Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 12/683,022

(22) Filed: Jan. 6, 2010

(65) Prior Publication Data

US 2010/0177570 A1 Jul. 15, 2010

(30) Foreign Application Priority Data

Jan. 9, 2009 (JP) ................................. 2009-003860

(51) Int. Cl.
*G11C 16/10* (2006.01)

(52) U.S. Cl. ......... 365/185.29; 365/185.23; 365/185.28; 365/189.11

(58) Field of Classification Search ............... 365/185.02
See application file for complete search history.

(56) References Cited

U.S. PATENT DOCUMENTS 5,787,034 A * 7/1998 Omino et al. ............ 365/185.02
6,256,250 B1 * 7/2001 Miki .............................. 365/226
6,430,087 B1 * 8/2002 Bill et al. ................. 365/185.23
7,345,335 B2 3/2008 Watanabe

FOREIGN PATENT DOCUMENTS

| JP | 9-35499 | 2/1997 |
|----|---------|--------|
| JP | 2002-133898 | 5/2002 |
| JP | 2008-54471 | 3/2008 |

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A voltage generating circuit generates, at a time of write, a first voltage which is higher than a program voltage, and generates an erase voltage at a time of erase. A first transistor has a current path and a gate, and the first voltage generated by the voltage generating circuit is supplied to one end of the current path and the gate of the first transistor. The first transistor outputs the program voltage from the other end of the current path thereof. A driving transistor has one end of a current path thereof connected to a word line, and has a gate supplied with the first voltage. The driving transistor has the other end of the current path supplied with the program voltage. Stress applying portion applies the erase voltage to the other end of the current path of the first transistor at the time of erase.

12 Claims, 3 Drawing Sheets

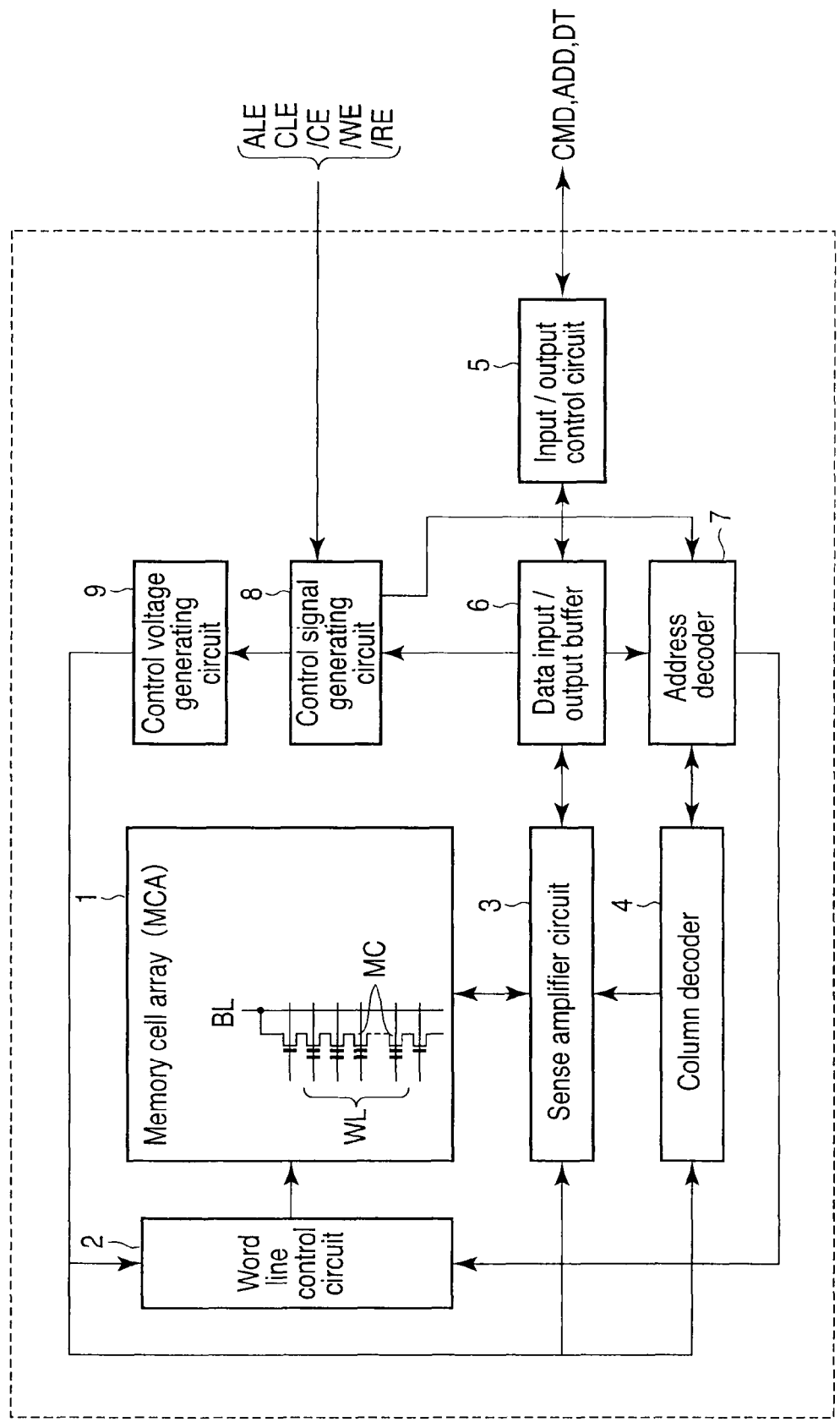
F I G. 1

SEMICONDUCTOR MEMORY DEVICE CAPABLE OF COMPENSATING VARIATION WITH TIME OF PROGRAM VOLTAGE

CROSS-REFERENCE TO RELATED APPLICATIONS

This application is based upon and claims the benefit of priority from prior Japanese Patent Application No. 2009-003860, filed Jan. 9, 2009, the entire contents of which are incorporated herein by reference.

BACKGROUND OF THE INVENTION

1. Field of the Invention

The present invention relates to a semiconductor memory device such as a NAND flash memory.

2. Description of the Related Art

In a NAND flash memory, a plurality of cells, which are arranged in a column direction, are connected in series, thereby constituting a NAND unit, and a plurality of NAND units constitute a block. Data write is executed in units of plural memory cells which are connected to a selected word line, and data erase is executed in units of a block.

A write voltage (program voltage) VPGM and an erase voltage VERASE of the NAND flash memory are generated by using a boost circuit which boosts, e.g. a power supply voltage (see, e.g. Jpn. Pat. Appln. KOKAI Publication No. 2008-54471). In the NAND flash memory, when data is written in a memory cell which is connected to a word line of a selected block, the program voltage VPGM is transferred to the word line via a driving transistor. One end of the current path of this driving transistor is connected to a control gate driver to which the program voltage VPGM is supplied, and the other end of the current path is connected to the word line. Further, the gate of the driving transistor is connected to a row decoder. By the activation of the row decoder, the driving transistor is turned on, and the program voltage VPGM that is supplied from the control gate driver is transferred to the word line. In addition, in order to transfer the program voltage VPGM, the voltage that is supplied from the row decoder to the gate of the driving transistor is set at VPGMH (=VPGM+Vth) which is higher than the program voltage VPGM by a degree corresponding to a threshold voltage Vth of the driving transistor.

On the other hand, at the time of erase, 0 V is transferred to the word line of the selected block via the driving transistor. Specifically, the gate of the driving transistor is set at the voltage VPGMH, the output voltage of the control gate driver is set at 0 V, and the word line is set at 0 V. In addition, the voltage of a p-type substrate is raised from 0 V to the erase voltage VERASE. Hence, a potential difference of the erase voltage VERASE occurs between the control gate and the substrate, and electrons are extracted from the floating gate to the substrate.

In a non-selected block, since the gate of the driving transistor is set at 0 V and the output voltage of the control gate driver is 0 V, the driving transistor is turned off, and the word line, which is connected to this driving transistor, is set in a floating state. At the time of erase, the voltage of the p-type substrate is boosted from 0 V to the erase voltage VERASE. Consequently, by the capacitive coupling between the substrate and the control gate, the potential of the control gate rises from 0 V to the neighborhood of VERASE. Since no potential difference occurs between the substrate and the control gate, the non-selected block is set in an erase non-selection state.

In the meantime, at the time of erase, in the driving transistor of the non-selected block, the drain (word line) is boosted to the erase voltage VERASE, and the gate and source are set at 0 V. Accordingly, a high electric field is applied between the drain and the gate and between the drain and the source. Thus, if the erase is repeatedly executed, the characteristics of the driving transistor may possibly vary.

On the other hand, even in the case where erase is repeated, the characteristics of a trimming transistor Tr_LIM, which generates a program voltage VPGM from a boost voltage VPGMH, do not vary. Thus, if the threshold voltage of the trimming transistor Tr_LIM is Vth(Tr_LIM), the output voltage V(Tr_LIM) of the trimming transistor Tr_LIM is expressed by $$V(Tr\_LIM)=VPGMH-Vth(Tr\_LIM)=VPGM.$$

For example, in the case where the threshold voltage Vth of the driving transistor rises due to a characteristic change of the driving transistor, if the variation amount of the voltage, which can be transferred to the word line at the time of write, is $\Delta Vth$, the transferable voltage VTr is expressed by $$VTr=VPGMH-(Vth(Tr\_LIM)-\Delta Vth)=VPGM-\Delta Vth.$$

As has been described above, in the case where the characteristics of the driving transistor have varied relative to the trimming transistor, it becomes difficult for the driving transistor to transfer the program voltage VPGM to the word line. A voltage, which is lower than the program voltage VPGM by $\Delta Vth$, is supplied. Furthermore, since the driving transistor is not fully rendered conductive, the current driving performance of the driving transistor lowers. Therefore, there has been a demand for a semiconductor memory device which can compensate a voltage which is supplied to the word line, even in the case where characteristics of the driving transistor of the word line have deteriorated.

BRIEF SUMMARY OF THE INVENTION

According to a first aspect of the invention, there is provided a semiconductor memory device comprising: a voltage generating circuit configured to generate, at a time of write, a first voltage which is higher than a program voltage, the voltage generating circuit generating an erase voltage at a time of erase; a first transistor having a current path and a gate, the first voltage generated by the voltage generating circuit being supplied to one end of the current path and the gate, the first transistor outputting the program voltage from another end of the current path thereof; a driving transistor having one end of a current path thereof connected to a word line, and having a gate supplied with the first voltage, the driving transistor having another end of the current path supplied with the program voltage that is output from the first transistor; and stress applying means for applying the erase voltage to the other end of the current path of the first transistor at the time of erase.

According to a second aspect of the invention, there is provided a semiconductor memory device comprising: a voltage generating circuit configured to generate, at a time of write, a first voltage which is higher than a program voltage, the voltage generating circuit generating an erase voltage at a time of erase; a first transistor having a current path and a gate, the first voltage generated by the voltage generating circuit being supplied to one end of the current path and the gate, the first transistor outputting the program voltage from another end of the current path thereof; and stress applying means for applying the erase voltage to the other end of the current path of the first transistor at the time of erase.

According to a third aspect of the invention, there is provided a stress applying method of a semiconductor memory device, comprising: generating a program voltage at a time of write by a first transistor, the program voltage being generated from a first voltage which is higher than the program voltage; and applying an erase voltage to the first transistor at a time of erase.

BRIEF DESCRIPTION OF THE SEVERAL
VIEWS OF THE DRAWING

FIG. 1 schematically shows the structure of a semiconductor memory device to which the present invention is applied;

DETAILED DESCRIPTION OF THE INVENTION

Figure 2:
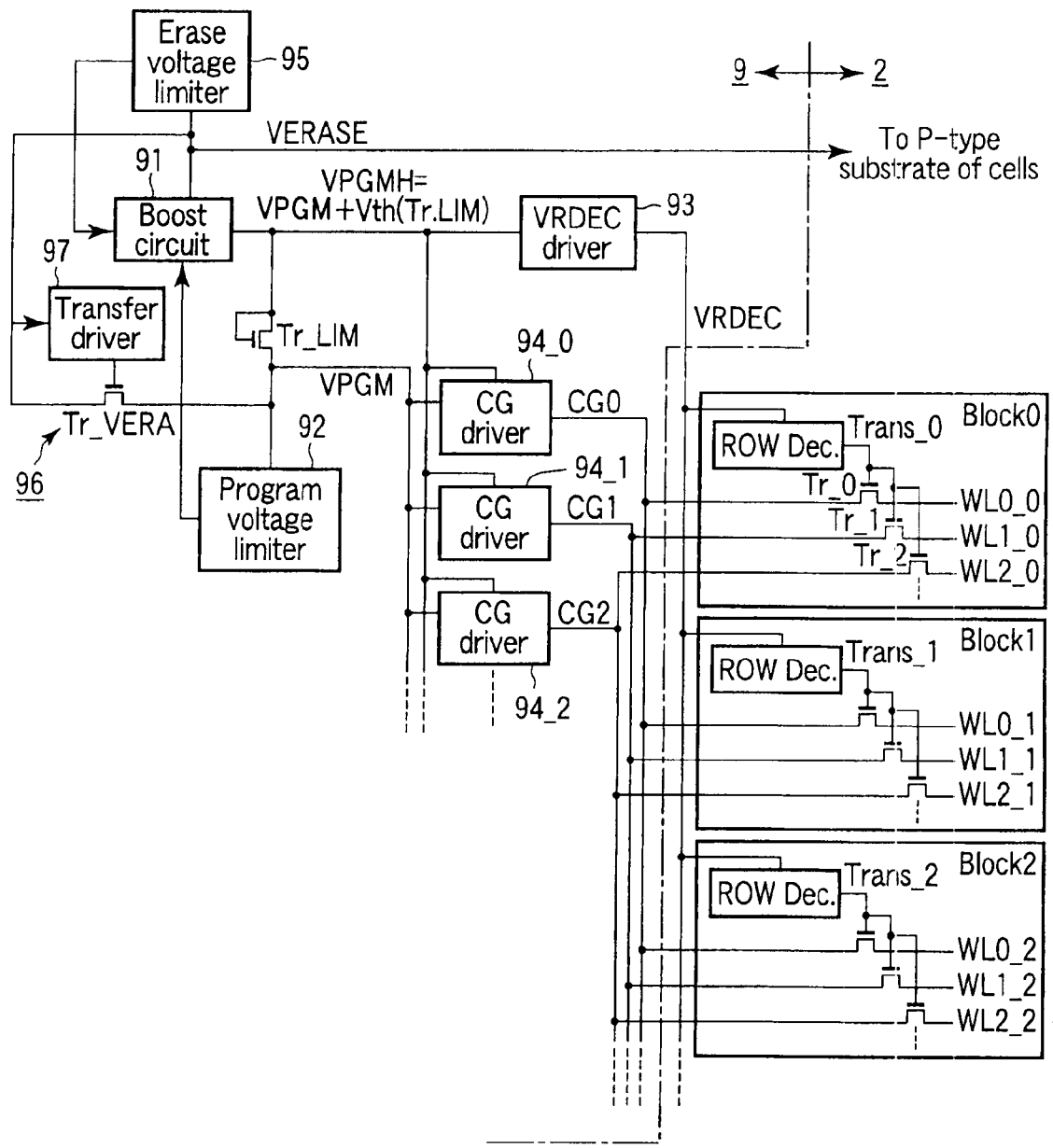
FIG. 2 is a circuit diagram showing an embodiment of the invention.

An embodiment of the present invention will now be described with reference to the accompanying drawings.

FIG. 1 schematically shows the structure of semiconductor memory device. In FIG. 1, a memory cell array 1 is composed of, for example, a NAND flash memory. Specifically, the memory cell array 1 is divided into a plurality of blocks as erase units, as will be described later. Each of the blocks includes a plurality of bit lines BL, a plurality of word lines WL, a common source line, and a plurality of memory cells MC that are composed of, e.g. EEPROMs, which are electrically data rewritable and arranged in a row direction and a column direction. A word line control circuit 2 including row decoders is connected to the word lines WL of the memory cell array 1, and selects and drives the word lines WL. A sense amplifier circuit 3 is connected to the bit lines BL of the memory cell array 1, and has a function of reading/writing data and a function of converting write data to the remaining number of times of write. A column decoder 4 outputs a column select signal for selecting bit lines of the memory cell array 1, in accordance with an output signal from an address decoder 7.

An input/output control circuit 5 receives various commands, address signals and write data, which are delivered from the outside. At the time of data write, write data is supplied from the input/output control circuit 5 to the sense amplifier circuit 3 via a data input/output buffer 6. At the time of data read, the data, which is read out to the sense amplifier circuit 3, is delivered to the input/output control circuit 5 via the data input/output buffer 6, and is then output to the outside from the input/output control circuit 5.

Address signals, which are delivered to the data input/output buffer 6 from the input/output control circuit 5, are supplied to the address decoder 7. Signals, which are decoded by the address decoder 7, are delivered to the word line control circuit 2 and column decoder 4.

In addition, a command, which is supplied from the input/output control circuit 5 to the data input/output buffer 6, is delivered to a control signal generating circuit 8. The control signal generating circuit 8 receives, from the outside, such external control signals as a chip enable signal /CE, a write enable signal /WE, a read enable signal /RE, an address latch enable signal ALE, and a command latch enable signal CLE. On the basis of the external control signal and command, which are supplied in accordance with an operation mode, the control signal generating circuit 8 generates a control signal for controlling a data write/erase sequence, and a control signal for controlling data read. The control signals are supplied to the control voltage generating circuit 9 and address decoder 7.

In accordance with various control signals that are supplied from the control signal generating circuit 8, the control voltage generating circuit 9 generates voltages which are necessary for various operations of the memory cell array, sense amplifier circuit 3 and column decoder 4, such as a read voltage, a program voltage, a verify voltage and an erase voltage.

FIG. 2 shows an embodiment of the word line control circuit 2 and control voltage generating circuit 9. The memory cell array 1 is divided into a plurality of blocks Block0, Block1, Block2, . . . . In the word line control circuit 2, each block, Block0, Block1, Block2, . . . , of the memory cell array 1 includes a row decoder RowDec and a plurality of driving transistors Tr_0, Tr_1, Tr_2, . . . . For example, in the block Block0, the current paths of the driving transistors Tr_0, Tr_1, Tr_2, . . . , are connected at one end to word lines WL0_0, WL1_0, WL2_0, . . . . An output signal Trans_0 of the row decoder RowDec is supplied to the gate of the driving transistor, Tr_0, Tr_1, Tr_2, . . . . The other blocks Block1, Block2, . . . , have the same structure as the block Block0.

In the control voltage generating circuit 9, a boost circuit 91 is composed of, for example, a charge pump circuit. At a program time, the boost circuit 91 boosts a power supply voltage and generates a write high voltage VPGMH. At an erase time, the boost circuit 91 boosts the power supply voltage and generates an erase voltage VERASE. The write high voltage VPGMH is supplied to the source and gate of a trimming transistor Tr_LIM. The trimming transistor Tr_LIM has a source and a gate which are connected to each other, and functions as a diode. The trimming transistor Tr_LIM outputs a program voltage VPGM from its drain. Specifically, the voltage VPGMH (=VPGM+Vth (Tr_LIM)), which is generated by the boost circuit 91, is a voltage which is higher than the program voltage VPGM by a degree corresponding to the threshold voltage Vth(Tr_LIM) of the trimming transistor Tr_LIM. The trimming transistor Tr_LIM generates the program voltage VPGM from the write high voltage VPGMH.

The drain of the trimming transistor Tr_LIM is connected to the boost circuit 91 via a program voltage limiter 92. For example, when the program voltage VPGM that is output from the drain of the trimming transistor Tr_LIM is higher than a predetermined value, the program voltage limiter 92 controls the boost circuit 91 and lowers the output voltage VPGMH.

The voltage VPGMH, which is generated by the boost circuit 91, is supplied to a row decoder (VRDEC) driver 93 and control gate (CG) drivers 94_0, 94_1 and 94_2. A signal VRDEC, which is output from the row decoder driver 93, is delivered to the row decoders RowDec of the blocks Block0, Block1, Block2, . . . . Each row decoder RowDec, when selected, generates a VPGMH-level signal, Trans_0, Trans_1, Trans_2, . . . , in accordance with the VPGMH-level signal VRDEC that is supplied from the row decoder driver 93, and delivers the signal, Trans_0, Trans_1, Trans_2, . . . , to the gate of the driving transistor, Tr_0, Tr_1, Tr_2, . . . .

The program voltage VPGM, which is output from the drain of the trimming transistor Tr_LIM, is supplied to the control gate (CG) drivers 94_0, 94_1 and 94_2. Each control gate (CG) driver, 94_0, 94_1, 94_2, generates a VPGMH-level signal, CG0, CG1, CG2, . . . , from the voltage VPGMH and program voltage VPGM, and supplies the signal, CG0, CG1, CG2, . . . , to the other end of the current path of the driving transistor, Tr_0, Tr_1, Tr_2, .... Each driving transistor, Tr_0, Tr_1, Tr_2, ..., has the gate supplied with the VPGMH-level signal Trans_0 (Trans_1, Trans_2, ...), and has the other end of the current path supplied with the VPGM-level signal CG0, CG1, CG2, .... Thus, the program voltage VPGM is supplied to the word lines WL0_0, WL1_0, WL2_0, ....

On the other hand, at the erase time, the erase voltage VERASE, which is generated by the boost circuit 91, is supplied to the P-type substrate or well region, on which the memory cell array is disposed, and is also supplied to an erase voltage limiter 95. For example, when the erase voltage VERASE becomes higher than a predetermined value, the erase voltage limiter 95 controls the boost circuit 91 so that the erase voltage VERASE may become equal to the predetermined value.

Further, one end of the current path of a transistor Tr_VERA, which constitutes a stress applying means 96, is connected to the drain of the trimming transistor Tr_LIM. The erase voltage VERASE, which is generated by the boost circuit 91, is supplied to the other end of the current path of the transistor Tr_VERA. A voltage VERASEH (=VERASE+Vth(Tr_VERA)) from a transfer driver 97 is supplied to the gate of the transistor Tr_VERA. The voltage VERASEH is a voltage which is higher than the erase voltage VERASE by a degree corresponding to the threshold voltage Vth(Tr_VERA) of the transistor Tr_VERA. At the erase time, the transfer driver 97 raises the erase voltage VERASE, which is supplied from the boost circuit 91, by a degree corresponding to the threshold voltage Vth(Tr_VERA), and supplies the raised voltage to the gate of the transistor Tr_VERA.

In the above-described structure, for example, when data is to be written in the memory cell that is connected to the word line WL0_0 of the block Block0, the program voltage VPGM, which is generated by the boost circuit 91 and trimming transistor Tr_LIM, is supplied to the CG driver 94_0, and the signal CG0 is output from the CG driver 94_0. By the selection of the row decoder RowDec of the block Block0, the driving transistor Tr_0 is turned on, and the output signal CG0 of the CG driver 94_0 is transferred to the word line WL0_0.

If it is assumed that the threshold voltage of the trimming transistor Tr_LIM and the threshold voltage of the driving transistor Tr_0 are substantially equal, a voltage VTr which can be transferred by the driving transistor Tr_0 is expressed by $$VTr = \text{gate potential} - Vth(Tr\_LIM)$$
$$= VPGMH - Vth(Tr\_LIM).$$

Since the threshold voltage of the trimming transistor Tr_LIM and the threshold voltage of the driving transistor Tr_0 are substantially equal, the voltage VTr is given by $$VTr = VPGMH - Vth(Tr\_LIM)$$
$$= VPGMH - Vth(Tr\_0)$$
$$= VPGM.$$

On the other hand, at the erase time, for example, if the block Block1 is selected, the signal, CG0, CG1, CG2, ..., is 0 V. By the selection of the row decoder RowDec of the block Block1, 0 V is transferred to the word line WL0_1, WL1_1, WL2_1, .... As regards the word lines of the non-selected blocks Block0, Block2, ..., other than the block Block1, since the gate is at 0 V and the signal, CG0, CG1, CG2, ..., is 0 V, the driving transistors remain in the OFF state. Accordingly, the word lines of the non-selected blocks Block0, Block2, ..., are in the floating state. At the erase time, the voltage of the substrate is raised from 0 V to the erase voltage VERASE. Thus, by the capacitive coupling effect with the substrate, the potential of the word line of the non-selected block Block0, Block2, ..., is raised from 0 V to the neighborhood of erase voltage VERASE. Since there is no potential difference from the substrate, the non-selected blocks are in an erase non-selection state.

At the erase time, the word lines of the non-selected blocks rise to the neighborhood of erase voltage VERASE. It is thus possible that the characteristics of the driving transistors Tr_0, Tr_1, Tr_2, ..., may vary.

Figure 3:
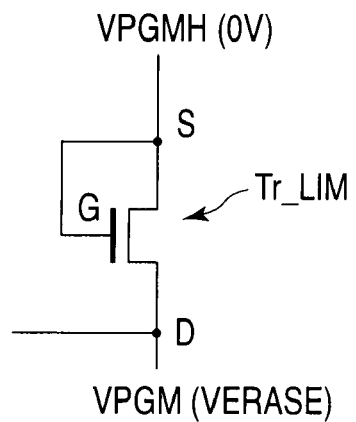
FIG. 3 shows the relationship in potential of a transistor at a time of erase.

However, in the case of the present embodiment, the transistor Tr_VERA is turned on during the erase operation, and the erase voltage VERASE is applied to the drain of the trimming transistor Tr_LIM. Hence, as shown in FIG. 3, a high electric field stress of the potential difference VERASE is applied between the drain (VERASE) and the gate (0 V) of the trimming transistor Tr_LIM and between the drain (VERASE) and the source (0 V) of the trimming transistor Tr_LIM. If the number of blocks is n, the stress applying time is (erase time)×n×(number of times of erase).

Figure 4:
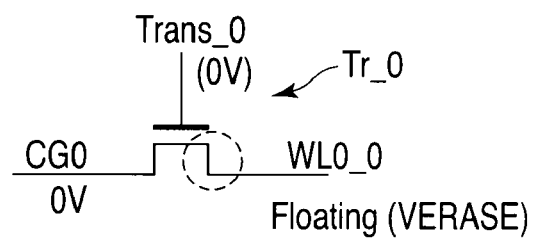
FIG. 4 shows the relationship in potential of another transistor at a time of erase.

On the other hand, a high electric field stress of the potential difference VERASE is applied to the driving transistor of each block, only when the block is in the non-selection state. For example, as shown in FIG. 4, a high electric field stress of the potential difference VERASE is applied between the drain (VERASE) and the gate (0 V) of the driving transistor Tr_0 and between the drain (VERASE) and the source (0 V) of the driving transistor Tr_0. In the case where the number of blocks is n, the stress applying time is (erase time)×(n−1)×(number of times of erase), since no stress is applied to the block Block0 at the selection time.

When data write is executed on the word line WL0_0 in this state, the potential VTr that can be transferred to the word line WL0_0 is given by $$VTr = \text{gate potential} - \text{threshold voltage}$$
$$= VPGMH - \{Vth(Tr\_0) + \Delta Vth(Tr\_0)\}$$
$$= \{VPGM + (Vth(Tr\_LIM) + \Delta Vth(Tr\_LIM))\} -$$
$$\{Vth(Tr\_0) + \Delta Vth(Tr\_0)\}.$$

If it is assumed that the threshold voltage Vth of the trimming transistor Tr_LIM and the threshold voltage Vth of the driving transistor Tr_0 are substantially equal, the potential VTr is expressed by VTr=VPGM−ΔVth(Tr_LIM)−ΔVth(Tr_0).

If the number of blocks is large, it is considered that the stress time of the trimming transistor Tr_LIM and the stress time of the driving transistor Tr_0 are substantially equal. Accordingly, if it is considered that the variation amount of the threshold voltage of the trimming transistor Tr_LIM and the variation amount of the threshold voltage of the driving transistor Tr_0 are substantially equal, the potential VTr is expressed by VTr=VPGM+ΔVth(Tr_LIM)−ΔVth(Tr_0)≈VPGM.

According to the above-described embodiment, at the erase time, the erase voltage is applied to the drain of the trimming transistor TrΔLIM via the transistor Tr_VERA, and the same stress as the stress to the driving transistors Tr_0, Tr_1, Tr_2, ..., is applied to the trimming transistor Tr_LIM. In other words, the stress is applied to the trimming transistor Tr_LIM with the same erase voltage and same erase time as the driving transistors Tr_0, Tr_1, Tr_2, .... Thus, even in the case where the characteristics of the driving transistors Tr_0, Tr_1, Tr_2, ..., are varied due to the high voltage which is applied at the erase non-selection time, the characteristics of the trimming transistor Tr_LIM are varied in the same manner as the driving transistors. Therefore, even in the case where the characteristics of the driving transistor are varied, the voltage that is supplied to the word line can be corrected and a predetermined program voltage can be transferred to the word line.

Furthermore, since the driving transistor can fully be rendered conductive, the current driving performance of the driving transistor can be prevented from deteriorating.

In the above-described embodiment, the present invention is applied to the NAND flash memory. However, the invention is not limited to the NAND flash memory, and is also applicable to other nonvolatile semiconductor memory devices such as NOR flash memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a voltage generating circuit configured to generate, at a time of write, a first voltage which is higher than a program voltage, the voltage generating circuit generating an erase voltage at a time of erase;
    a first transistor having a current path and a gate, the first voltage generated by the voltage generating circuit being supplied to one end of the current path and the gate, the first transistor outputting the program voltage from another end of the current path thereof;
    a driving transistor having one end of a current path thereof connected to a word line, and having a gate supplied with the first voltage, the driving transistor having another end of the current path supplied with the program voltage that is output from the first transistor; and
    stress applying means for applying the erase voltage to the other end of the current path of the first transistor at the time of erase.

2. The device according to claim 1, wherein the stress applying means is composed of a second transistor, the erase voltage is supplied to one end of a current path of the second transistor, a second voltage higher than the erase voltage is supplied to a gate of the second transistor, and the other end of the current path of the second transistor is connected to the other end of the current path of the first transistor.

3. The device according to claim 2, wherein the erase voltage is applied to the second transistor substantially the same number of times as the erase voltage is applied to the first transistor.

4. The device according to claim 2, wherein the second voltage is a voltage which is higher than the erase voltage by a degree corresponding to a threshold voltage of the second transistor.

5. The device according to claim 1, wherein the first voltage is a voltage which is higher than the program voltage by a degree corresponding to a threshold voltage of the first transistor.

6. A semiconductor memory device comprising:
    a voltage generating circuit configured to generate, at a time of write, a first voltage which is higher than a program voltage, the voltage generating circuit generating an erase voltage at a time of erase;
    a first transistor having a current path and a gate, the first voltage generated by the voltage generating circuit being supplied to one end of the current path and the gate, the first transistor outputting the program voltage from another end of the current path thereof; and
    stress applying means for applying the erase voltage to the other end of the current path of the first transistor at the time of erase.

7. The device according to claim 6, further comprising:
    a driving transistor having one end of a current path thereof connected to a word line, and having a gate supplied with the first voltage, the driving transistor having the other end of the current path supplied with the program voltage that is output from the first transistor.

8. The device according to claim 6, wherein the stress applying means is composed of a second transistor, the erase voltage is supplied to one end of a current path of the second transistor, a second voltage higher than the erase voltage is supplied to a gate of the second transistor, and the other end of the current path of the second transistor is connected to the other end of the current path of the first transistor.

9. The device according to claim 8, wherein the erase voltage is applied to the second transistor substantially the same number of times as the erase voltage is applied to the first transistor.

10. The device according to claim 8, wherein the second voltage is a voltage which is higher than the erase voltage by a degree corresponding to a threshold voltage of the second transistor.

11. The device according to claim 6, wherein the first voltage is a voltage which is higher than the program voltage by a degree corresponding to a threshold voltage of the first transistor.

12. A stress applying method of a semiconductor memory device, comprising:
    generating a program voltage at a time of write by a first transistor, the program voltage being generated from a first voltage which is higher than the program voltage; and
    applying an erase voltage to the first transistor at a time of erase.

* * * * *